United States Patent [19]

Sekihara et al.

[11] Patent Number: 4,716,369

[45] Date of Patent: Dec. 29, 1987

[54] HIGH SPEED IMAGING METHOD WITH THREE-DIMENSIONAL NMR

[75] Inventors: Kensuke Sekihara, Hachioji; Shigeru Matsui, Koganei; Hideki Kohno, Suginami; Etsuji Yamamoto; Hidemi Shiono, both of Akikawa, all of Japan

[73] Assignee: Hitachi, Ltd., Tokyo, Japan

[21] Appl. No.: 746,663

[22] Filed: Jun. 20, 1985

[30] Foreign Application Priority Data

Jun. 20, 1984 [JP] Japan .................. 59-126843
Jul. 6, 1984 [JP] Japan .................. 59-139001

[51] Int. Cl.$^4$ .......................................... G01R 33/20
[52] U.S. Cl. .......................................... 324/309
[58] Field of Search .......................... 324/309, 307

[56] References Cited

U.S. PATENT DOCUMENTS

| | | | |
|---|---|---|---|
| 4,070,611 | 1/1978 | Ernst | 324/309 |
| 4,165,479 | 8/1979 | Mansfield | 324/309 X |
| 4,451,788 | 5/1984 | Edelstein et al. | 324/309 |
| 4,506,222 | 3/1985 | Edelstein et al. | 324/309 |
| 4,509,015 | 4/1985 | Ordidge et al. | 324/307 X |
| 4,527,124 | 7/1985 | Van Uijen | 324/309 |
| 4,553,096 | 11/1985 | Randell | 324/309 |
| 4,570,119 | 2/1986 | Wehrli et al. | 324/309 X |
| 4,588,948 | 5/1986 | Mansfield | 324/309 |
| 4,602,214 | 7/1986 | Edelstein et al. | 324/309 |
| 4,672,318 | 6/1987 | Sekihara et al. | 324/307 |

FOREIGN PATENT DOCUMENTS

| | | | |
|---|---|---|---|
| 2789 | 10/1981 | PCT Int'l Appl. | 324/307 |
| 2056078 | 3/1981 | United Kingdom | 324/307 |
| 2082775 | 3/1982 | United Kingdom | 324/307 |
| 2091884 | 8/1982 | United Kingdom | 324/307 |
| 2125563 | 3/1984 | United Kingdom | 324/309 |

Primary Examiner—Tom Noland
Attorney, Agent, or Firm—Antonelli, Terry & Wands

[57] ABSTRACT

The present invention is an imaging method using three-dimensional NMR to which an echo-planar method is applied. After excitation of nuclear spins, the gradient magnetic field Gx for phase-encoding is applied and there is repeated a sequence of measuring and obtaining an echo train of spin-echoes with a constant gradient magnetic field Gx and a periodically-inverted gradient magnetic field Gy, as varying the amount of encoding, so as to obtain the three-dimensional imaging by the Fourier-conversion. Moreover, after the selective excitation of spins within an X-Y surface, a 180° radio frequency pulse is applied. As varying the time difference $\tau_e$ between the interval from the excitation until the application of the 180° radio frequency pulse and the interval from the application thereof until a peak of a first echo of an echo train, three-dimensional imaging is carried out with a chemical shift axis as one axis by repeating the sequence and accomplishing Fourier-conversion with $\tau_e$ as a numerical variable.

9 Claims, 4 Drawing Figures

HIGH SPEED IMAGING METHOD WITH THREE-DIMENSIONAL NMR

BACKGROUND OF THE INVENTION

The present invention relates to a measuring device for non-destructive measurement of nuclear spin distribution, relaxation time distribution, and the like, of an object, by means of nuclear magnetic resonance, and more particularly to a method and a device for accomplishing high-speed three-dimensional imaging.

In 1946, Bloch and Purcell separately discovered the nuclear magnetic resonance (hereinafter, referred to as NMR) phenomenon that, when a nuclei with a finite number of spin quanta such as protons ($^1H$) or the like is put into a magnetic field, a radio frequency wave definitively formed by the intensity of the magnetic field and the nuclei is resonantly absorbed thereby. NMR has come to be almost indispensable in the physical and the chemical fields such as structural analysis of a substance or the like. Further, the energy in the magnetic field of the NMR is remarkably small (about $10^{-9}$) in comparison with the radiation energy of X-rays and has almost no effect on living tissue. Thus, there has been rapid progress in the techniques of acquiring local information in living tissue, mainly $^1H$ as an image by means of the principle of NMR.

In order to accomplish such imaging, it is necessary to spatially resolve the information relating to nuclear spins. To realize this aim, there have been proposed some methods such as the sensitive point method, the projection-reconstruction method and the like.

Of these, as a method for realizing three-dimensional imaging, the method referred to as "three-dimensional Fourier imaging" is disclosed in the *Journal of Magnetic Resonance* Vol. 18 (1975) pp. 69–83. This is the method wherein first, second and third gradient magnetic fields, crossing one another at right angles, are sequentially applied and a free induction signal (FID) during the period of applying a third magnetic field is measured. The first and the second gradient magnetic fields are respectively utilized for encoding the information of phase positions of the nuclear spins. This method has the disadvantage in that when defining a picture element as $M^3$, FID must be measured $M^2$ times and thus when M is large, the measuring time is made very long.

Chemical shift imaging can be considered as one kind of plural-dimensional imaging. This is the method of realizing the three-dimensional imaging as defining one axis of three dimensions as a chemical shift axis, that is, the axis showing a small shift (chemical shift) of a resonance frequency caused by the difference of chemical coupling at one nuclei. Particularly, it is known that the distribution of several phosphorous compounds in a living tissue can effectively inform an observer of the metabolic state of a living tissue. Thus, it is expected that realizing the device for accomplishing the imaging of $^{31}P$ chemical shift is a great contribution towards a biochemical diagnosis of a body. One example of chemical shift imaging is shown in, for example, "A. A. Maudsley et. al. *Spatially Resolved High Resolution Spectroscopy* by *Four-Dimensional NMR* J. Maga. Reson. 51, 147–152 (1983)". This method is slightly different because it measures an FID with chemical shift without using the third gradient magnetic field against the above-stated three-dimensional Fourier imaging. Thus, it also has the disadvantage that when defining the number of picture elements as $M^3$, the $M^2$ time of FID must be measured similarly as above.

SUMMARY OF THE INVENTION

It is an object of the present invention to provide an NMR imaging method for accomplishing high speed three-dimensional imaging.

It is another object of the present invenion to provide an NMR imaging method which can collect spatially-distributed chemical shift information to create an image at a high speed.

The present invention is designed by applying an echo-planar method proposed as a method for expanding two-dimensional imaging (refer to *Journal of Magnetic Resonance* Vol. 29 (1978) pp. 355–373) to the three-dimensional imaging. The above-stated echo planar method has the function of simultaneously applying the gradient magnetic fields in two directions after the excitation of nucler spin, when one gradient magnetic field is stronger than the other one and the direction of the gradient is periodically inverted. A plurality of spin-echos (an echo train) are generated by the inversion and are then measured. However, it is impossible to realize the expansion of the concept of this echo planar method to three-dimensional imaging without any change, that is, without varying respective intensities of the gradient magnetic fields in three directions and applying them simltaneously, because the measurement of the NMR requires a wide frequency band.

One of the features of the present invention is to have a series of sequences including: exciting nuclear spins of the object in a homogeneous static magnetic field; applying a 180° RF pulse after a predetermined time has passed; applying a first gradient magnetic field with a predetermined amplitude to impart a spatial gradient along the first direction to the intensity of the homogeneous static magnetic field within a certain time during the period from said excitation until the generation of the echo signal by applying the 180° RF pulse magnetic field; applying second and third gradient magnetic fields for respectively imparting to said magnetic fields spatial gradients along second and third directions perpendicular to said first direction and crossing each other at right angles, wherein one of the second and third gradient magnetic fields is periodically inverted so as to form an echo train of spin-echos; and measuring the echo train, and to repeat the series of sequences a plurality of times by sequentially varying the intensity of the first gradient magnetic field or the application time thereof and then to carry out the three-dimensional imaging by Fourier-converting the imaging signal obtained by this repetition.

Another feature of the present invention is, to excite nuclear spin in a specific slice of an object placed under a homogeneous static magnetic field by applying a 90° RF pulse having a limited frequency band to the object together with a first gradient of the magnetic field along a first direction, to apply a 180° RF magnetic field pulse to the object after a predetermined time has passed since this excitation, to apply respective second and third gradients of the magnetic field along the second and the third directions crossing at right angles within the slice surface over a first period of phase-dispersing the nuclear spin and a second period of obtaining an echo train of spin-echoes, wherein during this second period, one of the second and third gradients of the magnetic fields is periodically inverted, and further to have a series of sequences including the measuring of said echo train, wherein there exists a predetermined time difference between the period from the excitation until the application of said 180° RF pulse and the period from the application until a peak of a first spin-echo in said echo train and the series of sequences is repeated by sequentially varying the time difference, and the measuring signal obtained by this repetition is Fourier-converted with the time difference as a variable in order to obtain a chemical spin shift distribution of the nuclear spin within the slice.

DESCRIPTION OF THE EMBODIMENTS

Figure 1:
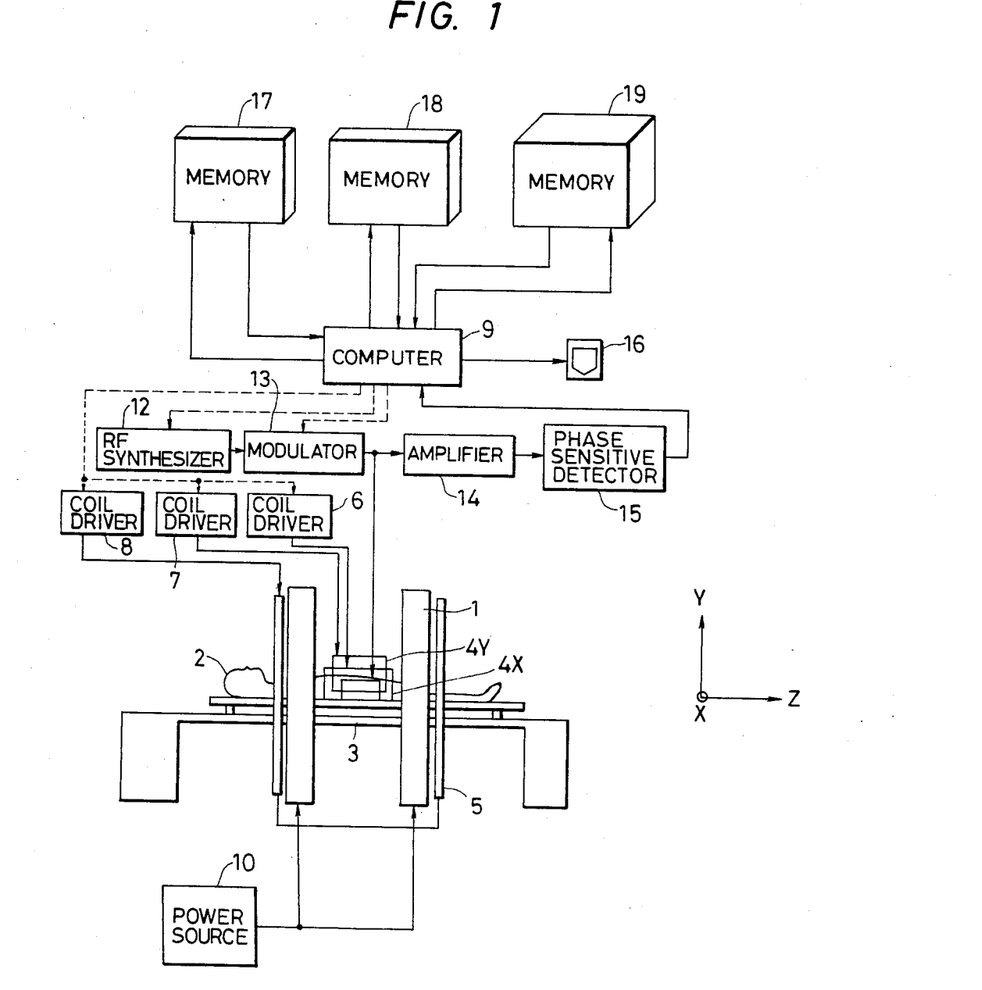
FIG. 1 is a block diagram showing one embodiment of the present invention.

FIG. 1 is a schematic block diagram of a measuring device employing nuclear magnetic resonance according to one embodiment of the present invention (hereinafter, referred simply as to "measuring device").

In FIG. 1, 1 denotes a coil for generating a static magnetic field and is supplied with a certain current from a power source 10 so as to apply a homogeneous static magnetic field Ho to an object 2. Gradient coils 5 are composed of circular lines wired so as to cause the currents to flow in opposite directions and which serve to generate a z-direction gradient magnetic field pulse for providing the intensity of the static magnetic field with a spatial gradient along a z-axis direction when the current is caused to flow by a coil driver 8.

Gradient coils 4x and 4y are respectively driven by coil drivers 6 and 7 and, thereby, serve to generate x-direction and y-direction gradient magnetic field pulses for providing the intensity of the static magnetic field with spatial gradients along the x-axis and y-axis. The coil drivers 6, 7 and 8 serve to drive respective coils in accordance with instructions from a computer 9.

The RF pulse for exciting nuclear spins of an object 2 can be generated by the method wherein the radio frequency (RF) wave generated by a RF synthesizer 12 is waveform-shaped and power-amplified by a modulator 13 and then the current is supplied to the coil 3. The signal from the object 2 is received by coil 3 and is passed through an amplifier 14. After that, a phase sensitive detector 15 serves to quadrature-detect the signal and then it is input to the computer 9. The computer 9 displays the image corresponding to the density distribution of nuclear spins or the image showing chemical shift information in a CRT display after processing the signal.

Further, 17, 18 and 19 denote memories used for the operation to obtain the image corresponding to the density distribution of nuclear spin or the chemical shift distribution shown in the CRT display. These are described in detail, later.

Figure 2:
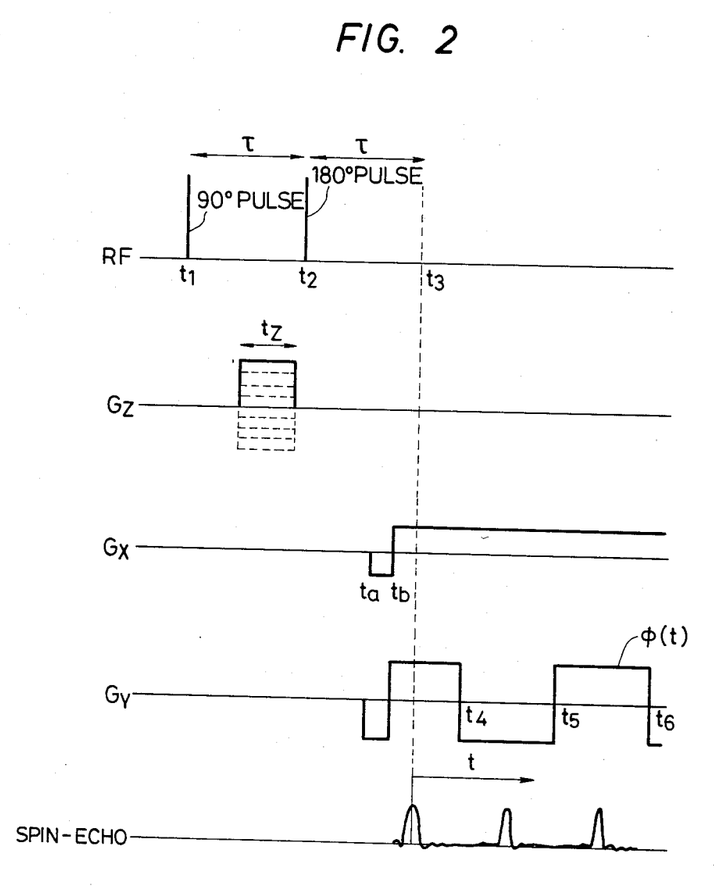
FIG. 2 is a time sequence view of one embodiment of the present invention.

FIG. 2 shows the timing of the application of the gradient magnetic fields in the x-, y- and z-directions and the RF magnetic field when carrying out three-dimensional imaging of the nuclear spin distribution in this device. The 90° RF pulse is applied at the time point $t_1$ so as to tilt the nuclear spins in the object by 90° to excite the nuclear spin. Next, a z-direction gradient magnetic field $G_z$ is applied during a certain time and the spatial information is encoded at the spin phase along the z-direction. At the time point $t_2$ when the time $\tau$ hs elapsed since $t_1$, the 180° pulse is applied so as to bring about a peak of the spin-echo at the time point $t_3$ when the time $\tau$ has elapsed since $t_2$. Following this, the signal measuring is carried out at the time point $t_3$.

The monitoring of the NMR signal is carried out while applying an x-direction gradient magnetic field $G_x$ for a predetermined time and a y-direction gradient magnetic field $G_y$ which is periodically inverted as shown at $t_4$, $t_5$ and $t_6$. The $G_y$ intensity is tens of times as high as that of the $G_x$ and the spin-echoes with the peaks are generated a plurality of times after a certain time has elapsed after the inversion of $G_y$. It is difficult to abruptly raise $G_x$ and $G_y$ and the monitoring of the signal at $t_3$. Thus, at the time point $t_a$, the gradient magnetic fields $G_x$ and $G_y$ in the reverse directions to that at the time point $t_3$ are respectively applied so as to accomplish the dephasing of the nuclear spins. Next, at the time point $t_b$, the directions of $G_x$ and $G_y$ are made to be inverted so as to accomplish the rephasing of the nuclear spins. By this method, it is possible to obtain the peak of the first spin-echo accurately at the time point $t_3$.

The sequence of actions just described is repeated a plurality of times so as to vary the amplitude of $G_z$ in increments. When the number of picture elements in the z-axis direction is shown as $N_z$, the measuring is repeated $N_z$ times by means of $N_z$ ways of $G_z$. Moreover, it is also possible to vary the application time $t_z$, rather than the amplitude of $G_z$.

Further, FIG. 2 shows that $G_y$ is varied in square-wave increments, but it is to this variation not limited, for example, it can be varied sinusoidally. Furthermore, $G_x$, $G_y$ and $G_z$ are all freely interchangeable.

In the pulse sequence shown in FIG. 2, the two-dimensional signal $S(G_z, t)$ measured by varying $G_z$ has the following relation between the spin density distribution $\rho(x, y, \text{and } z)$ and itself.

$$S(G_z, t) = \int \rho(x, y, z) \exp\left\{ i\gamma \left[ zG_z t_z + xG_x t + yG_y \int_0^t \phi(t')dt' \right] \right\} dx\, dy\, dz \quad (1)$$

wherein $\phi(t)$ is an applied waveform of the y-direction gradient magnetic field.

Then $S(G_z, t)$ is Fourier-converted with respect to $G_z$ so as to obtain $S'(t)$.

$$S'(t) = \int S(G_z, t) e^{-2\pi i f_z G_z} dG_z \quad (2)$$

The formula (2) is substituted for the formula (1).

$$S'(t) = \int \rho(x, y, z) \int \exp\left\{ 2\pi i \left[ \frac{\gamma}{2\pi} zt_z - f \right] G_z \right\} dG_z \quad (3)$$

$$\exp\left\{ i\gamma \left[ xG_x t + yG_y \int_0^t \phi(t')dt' \right] \right\} dx\, dy\, dz$$

is obtained.

$$\int \exp\left\{2\pi i\left[\frac{\gamma}{2\pi}zt_z - f\right]G_z\right\}dG_z = \delta\left[\frac{\gamma}{2\pi}zt_z - f\right]$$

is substituted for the formula (3) and finally, $$S'(t) = \int \rho(x, y, f_z)\exp\left\{i\gamma\left[xG_xt + yG_y\int_0^t \phi(t')dt'\right]\right\}d_xd_y \quad (4)$$

is obtained. From this formula (4), $\rho(f_x, f_y, f_z)$ is obtained, wherein $$\text{wherein } f_x = \frac{\gamma}{2\pi}G_x^x, f_y = \frac{\gamma}{2\pi}G_y^y.$$

In the present embodiment, $G_x$ is constant. Further, the time waveform $\phi(t')$ of the y-direction gradient magnetic field $G_y$ was found beforehand. Thus, $$\exp\left[-2\pi i f_y \int_0^t \phi(t')dt'\right]$$

was computed in advance and it is multiplied by $S'(t)$ in the formula (4). Namely, $$S'(t)\exp\left[-2\pi i f_y \int_0^t \phi(t')dt'\right]$$

is computed. By Fourier-conversion of the function of this product, it is possible to obtain spin density distribution $\rho(f_x, f_y, f_z)$. Namely, it is $$\rho(f_x, f_y, f_z) = \int S'(t)\exp\left[-2\pi i f_y \int_0^t \phi(t')\right]e^{-2\pi i f_x t}dt \quad (5)$$

Next, is a description of how the computing process as described above is accomplished in the hardware shown in FIG. 1.

The amplitude of $G_z$ is varied in the total $N_z$ ways at the $\Delta G_z$. In case the NMR signal in the number n of measuring (n=1, ..., $N_z$) is shown by Sn(t), Sn(t) is made discrete and measured at the time width $\Delta t$.

The size of an image matrix is defined as M×M and pixel size in the x-direction and y-direction is respectively expressed as $\Delta x$ and $\Delta y$. In this case, there are required a three-dimensional memory having a capacity of $2 \times N_z \times M$ as a memory 17 in FIG. 1, a three-dimensional memory having a capacity of $2 \times M \times M$ as a memory 18 and a three-dimensional memory having a capacity of $N_z \times M \times M$ as a memory 19.

At first, by repeating the sequence shown in FIG. 2, the signal Sn(m$\Delta$t) measured at the discrete points (m=0, 1, ..., M−1, n=1, 2, ..., $N_z$) is stored in the memory 17. The measuring is carried out by the quadarature phase detection and thus $2 \times M \times N_z$ of data is stored. The memory 18 stores $$\exp\left[-i\gamma l\Delta y G_y \phi(m\Delta t)\right]$$

(l=0, 2, ..., M−1, m=0, 1, ..., M−1) sought by the computation in advance as a numerical value. Herein, the relation of $$\phi(t) = \int_0^t \phi(t')dt'$$

is established.

With respect to the data stored in the memory 17, in the case of m=0, $S_1(0), S_2(0), ..., S_{Nz}(0)$, the data is called into the computer 9, discrete-Fourier-converted and stored in the original locations in the memory 17. This data after Fourier-conversion is expressed as $\tilde{S}_n(0)$, (n=1, 2, ..., $N_z$). With respect to the data from m=0 to m=M−1, $\tilde{S}_n(m\Delta t)$ is computed by a similar process and is stored in the memory 17. By this method, the content of the memory 17 is changed from $S_n(m\Delta t)$ to $\tilde{S}_n(m\Delta t)$ (n=1, 2, ..., $N_z$ m=0, 1, ... MM−1).

Next, from the memory 18 to the computer 9, $$\exp\left[-i\gamma l\Delta y G_y \phi(m\Delta t)\right]$$

is called and then the product of $\tilde{S}_n(m\Delta t)$ called out of the memory 17, $$\tilde{S}_n(m\Delta t)\exp\left[-i\gamma l\Delta y G_y \phi(m\Delta t)\right]$$

is computed at each m. This product is expressed as Pn (m$\Delta$t). Namely, it is $$Pnl(m\Delta t) = \tilde{S}_n(m\Delta t)\exp\left[-r\gamma l\Delta y G_y \phi(m\Delta t)\right]$$

For all the combinations of the value (n,l), $$\{Pnl(m\Delta t); m=0, 1, ..., M−1\}$$

is discrete-Fourier-converted with respect to m by means of the computer 9. The data after the Fourier-conversion is expressed as $$\{\tilde{P}nl(m); m=0, 1, ..., M−1\}$$

The real part of $\tilde{P}nl(m)$ is stored in the three-dimensional memory 19. This $\tilde{P}nl(m)$ corresponds to the discrete computing results of $\rho(f_x, f_y, f_z)$ shown by the formula (5) and represents a three-dimensional image obtained by the measuring described above.

As stated above, the memory 19 stores the data showing the three-dimensional distribution of the nuclear spin density of the object 2. On the contrary, a display unit 16 generally shows a two-dimensional image. Accordingly, it selects the two-dimensional data showing an optional section out of the stored three-dimensional image data.

Figure 3:
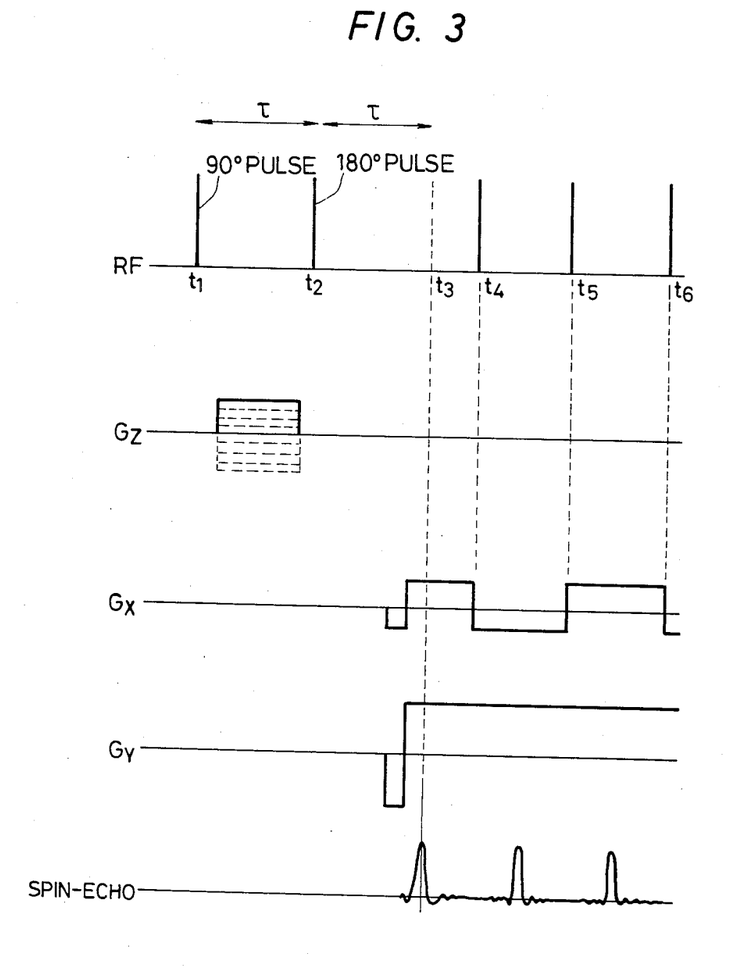
FIG. 3 is a time sequence view of another embodiment of the present invention.

FIG. 3 shows the pulse sequence of another embodiment in the present invention. This sequence differs from the sequence in FIG. 2 in that the direction of spin is inverted by applying a 180° RF pulse at the time points $t_4$, $t_5$ and $t_6$ in place of inverting the gradient magnetic field $G_y$, $G_x$ is required to be inverted at the time points $t_4$, $t_5$ and $t_6$ so as to obtain the equivalent effect with the case of applying $G_x$ in a certain direction. This sequence can bring a plurality of spin echoes (echo train) quite similarly with the sequence in FIG. 2. It is possible to realize three-dimensional imaging by repeating this sequence while varying the intensity of the applied $G_z$. In the present embodiment, since the gradient magnetic field having the smaller intensity of the gradient magnetic fields applied at the signal measuring period is inverted, it has an advantage that it is easier to invert the gradient magnetic field in comparison with the sequence in FIG. 2.

An example has been described for carrying out three-dimensional imaging of the spring density of an object, but it is possible to realize the three-dimensional imaging including the information as to the longitudinal relaxation time of spins. Namely, a 180° RF pulse should be applied a predetermined time before the 90° RF pulse as shown in FIG. 2 or FIG. 3 is applied and the sequence including the application of this 180° RF pulse should be repeated.

Figure 4:
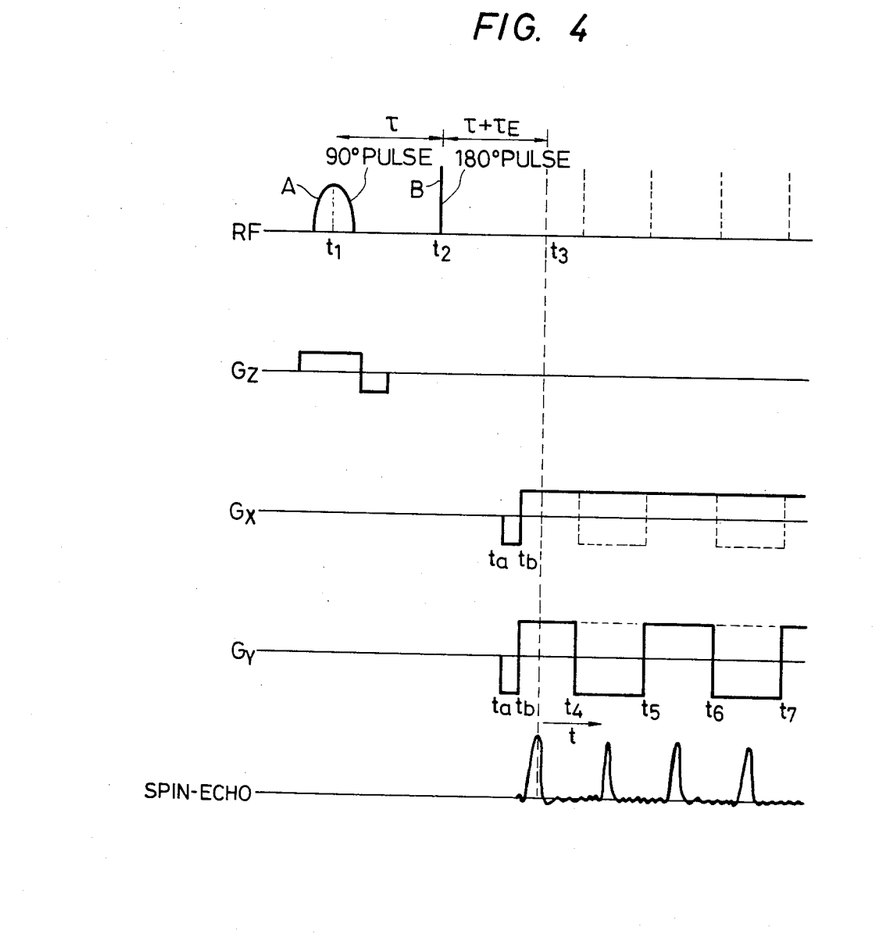
FIG. 4 is a time sequence view of another embodiment of the present invention.

FIG. 4 shows an embodiment for accomplishing chemical shift imaging. The present embodiment discloses the example of carrying out chemical shift imaging of nuclear spin within a vertical slice of a z-axis.

This differs from the conventional echo planar method in that the interval between the time point $t_1$ for applying a 90° RF pulse A and the time point $t_2$ for applying a 180° RF pulse B is different from the interval between the time point $t_2$ and the time point $t_3$ for generating a peak of the first spin-echo.

At first, the nuclear spins within a specific slice are selectively excited by applying the 90° RF pulse A having a limited frequency, in addition to applying the gradient magnetic field $G_z$. The nuclear spin is considered to be excited at the time point $t_1$ of the peak of the 90° RF pulse A. The 180° RF pulse B is applied at the time point $t_2$ when the time $\tau$ is passed since $t_1$. Next, at the time point $t_a$, the x-direction gradient magnetic field $G_x$ and the y-direction gradient magnetic field in the negative direction are applied so as to carry out the dephasing of the nuclear spins. Next, $G_x$ and $G_y$ are inverted in the positive direction at the time point $t_b$ so as to rephase the nuclear spins. The intensity of $G_y$ has a larger value than that of $G_x$ similarly with FIG. 2. However, in the present embodiment, the periods of $t_a$ and $t_b$ should be selected so that the time point $t_3$ of generating the peak of the first spin-echo by rephasing is made to occur at the time point when the time $(\tau+\tau_\epsilon)$ has elapsed after $t_2$. The monitoring of the NMR signal is started at the time point $t_3$. During the signal-monitoring period, it is necessary to generate an echo train by inverting $G_y$ at $t_4$, $t_5$, $t_6$ and $t_7$, similarly with FIG. 2.

The above-stated sequence of actions is repeated as varying the value of $\tau_\epsilon$. The two-dimensional signal $F(\tau,\tau_\epsilon)$ has the following relation between itself and the spin density distribution $C(X,Y)$ within the $(X,Y)$ surface;

$$F(t, \tau_\epsilon) = e^{-\frac{2\tau}{T_2}} \int C(X, Y) e^{-\frac{\tau_\epsilon}{T_2}} e^{-\frac{t}{T_2}} \quad (6)$$

$$\exp[it\{XG_xt + YG_y\phi(t)\}]d \times dY$$

This $F(t,\tau_\epsilon)$ is multiplied by $\exp[i2\pi f y\phi(t)]$ and the product is two-dimensionally Fourier-converted with regard to $t$ and $\tau_\epsilon$ so as to provide distribution of the chemical shift within the $(X,Y)$ surface. It is expressed as follows;

$$S(f_X, f_Y, f) = \iint F(t, \tau_\epsilon)\exp[i2\pi f y\phi(t)]e^{-2\pi i(f_X t + f \tau_\epsilon)}dt d\tau_\epsilon \quad (7)$$

$S(f_x, f_y, f)$ is defined by this formula. In case formula (4) is substituted for formula (7), $$S(f_X, f_Y, f) = \iint \left[\left[\int C(X, Y)\left\{\int e^{-\frac{\tau_\epsilon}{T_2}} e^{-2\pi i f \tau_\epsilon} d\tau_\epsilon\right\}\right.\right. \quad (8)$$

$$\left.\left.\exp[2\pi i f y\phi(t)]e^{-2\pi i f X t} dt\right]\right] dXdY$$

is derived. By substituting the data for the area of the Fourier conversion origin-symmetrically with regard to a variable, the formula in the right side brackets of formula (8) is $$\int e^{-\frac{\tau_\epsilon}{T_2}} e^{-2\pi i f \tau_\epsilon} d\tau_\epsilon = \frac{T_2}{1 + (2\pi T_2 f)^2} \quad (9)$$

and finally, formula (8) is made to be;

$$R_e\{S(f_X, f_Y, f)\} = C(f_X, f_Y)\frac{T_2}{1 + (2\pi T_2 f)^2} \quad (10)$$

where Re{ } expresses the real part of the equation and is;

$$f_X = \frac{\tau}{2\pi} G_X X, f_Y = \frac{\tau}{2\pi} G_Y Y$$

when the number k of chemical shift is $H_0\delta_K$ and the spin density distribution having this chemical shift is $C_k(X, Y)$, the formula (10) is $$R_e\{S(f_X, f_Y, f)\} = \quad (11)$$

$$\sum_k C_k(f_X, f_Y) \frac{T_2}{1 + \left[2\pi T_2\left(f - \frac{\gamma}{2\pi} H_0\delta_k\right)\right]^2}$$

The formula (11) shows that it is possible to obtain this distribution within the $(X, Y)$ surface of the chemical shift from the real part of $S(f_X, f_Y, f)$.

The computation shown above can be realized by the computer 9 and the memories 17, 18 and 19 as shown in FIG. 1. In case the size of the image matrix is M×M and $\tau_\epsilon$ is varied in the total N ways at the $\Delta\tau$ step, it is necessary to respectively design the memory 17, the memory 18 and the memory 19 to be a three-dimensional memory of $2 \times N_c \times M$, a three-dimensional memory of $2 \times M \times M$ and a three-dimensional memory of $N_c \times M \times M$, respectively.

The NMR signal in the number n of measuring (n=1, 2, ... $N_c$) is expressed as $S_n(t)$, $S_n(t)$ is made discrete at the time width $\Delta t$ and measured.

At first, the signal $S_n(m, \Delta t)$ is stored in the memory 17(m=0, 1, ..., M−1 and n=1, 2, ..., $N_c$). In the present embodiment, measuring is carried out by quadarature phase detection; hence the memory 17 stores 2×N×M of data.

The memory 18 stores in advance exp [iγΔy $G_y\phi(m\Delta t)$] (=0, 1, ..., M−1 and m=0, 1, ..., M−1) as a numeral value, where $$\phi(t) = \int_0^t \dot{\phi}(t')dt'.$$

In the data stored in the memory 17, $S_1(0)$, $S_2(0)$, ..., $S_N(0)$ are called out of the computer 9 in the case of $m=0$ and are discrete-Fourier-converted. Then, they are stored in the original locations in the memory 17. The data after the Fourier-conversion is expressed as $\bar{S}n(0)$, $(n=1, 2, ..., N)$. With regard to the data from $m=1$ to $m=M-1$, $\bar{S}n(m\Delta t)$ is computed in the same process as the above and is stored in the memory 17. Thus, the content of the memory 17 is replaced with $\bar{S}n(m\Delta t)$ to $Sn(m\Delta t)$ $(n=1, 2, ..., N, m=0, 1, ..., M-1)$ $(n=1, 2, ..., N_c, m=0, 1, ..., M-1)$.

Next, $\exp[i\gamma l\Delta y\, G_y\phi(m\Delta t)]$ is called from the memory 18 to the computer 9 and is multipled by $Sn(m\Delta t)$ called from the memory 17. The product of $Sn(m\Delta t)$ $\exp[i\gamma l\Delta y\, G_y\phi(m\Delta t)]$ is computed with respect to each $m$. This product is expressed as $Prl(m\Delta t)$. Namely, it is;

$$P_{nl}(m\Delta t) = \bar{S}_n(m\Delta t)\exp[it l\Delta_y \gamma G_y\phi(m\Delta t)] \quad (12)$$

For all the combinations of the value (n,l), the data combination $\{Pnl(m\Delta t): m=0, 1, ..., M-1\}$ is discrete-Fourier-converted with respect to n by means of the computer 9. The data after the Fourier-conversion is expressed as $\{\bar{P}nl(m): m=0, 1, ..., M-1\}$. The real part of this $Pnl(m)$ is stored in the threedimensional memory 19. This $\bar{P}nl(m)$ corresponds with the discrete computing results of $Re\{S(f_x, f_y, f)\}$ shown in the formula (9) and shows the chemical shift distribution within the (X, Y) surface.

Accordingly, in the present embodiment, in case the number of the divisional dots of the chemical shift axis and the image matrix are respectively N and M×M, it is possible to obtain the chemical shift image by accomplishing signal measuring $N_c$ times (the $N_c$-times-repetition of the sequence shown in FIG. 4).

In the case of the chemical shift imaging described above, it is possible to obtain an echo train equivalent to the other cases by defining Gy in a certain direction, periodically inverting Gx and applying a 180° RF pulse in synchronization with this inversion. The sequence in this case is shown by a dotted line in FIG. 4.

We claim:

1. A high speed imaging method using three-dimensional NMR comprising the steps of:
   (a) exciting nuclear spins of an object placed under a homogeneous static magnetic field;
   (b) applying a 180° radio frequency pulse to said object a predetermined time after said excitation;
   (c) applying a first gradient magnetic field with a predetermined amplitude for providing said static magnetic field with a spatial gradient along a first direction within a certain time during the period from said excitation until the generation of an echo signal by the application of said 180° radio frequency pulse;
   (d) applying second and third gradient magnetic fields for providing said static magnetic field with respective spatial gradients along a second and a third direction perpendicular to said first direction, wherein one of said second and third gradient magnetic fields is constant and the other is periodically inverted so as to form an echo train of;
   (e) repeating said steps (a)–(d) a plurality of times to obtain a measured signal by each repetition, the amplitude of said first gradient magnetic field being sequentially varied in each repetition; and
   (f) Fourier-converting the measured signal obtained by each said repetition so as to obtain a three-dimensional distribution of nuclear spins in said object.

2. The high speed imaging method using three-dimensional NMR according to claim 1, wherein said third gradient magnetic field has a higher intensity than said second gradient magnetic field and said third gradient magnetic field is periodically inverted.

3. The high speed imaging method using three-dimensional NMR according to claim 1, wherein said third gradient magnetic field has higher intensity than said second gradient magnetic field, said third gradient magnetic field is constant and said second gradient magnetic field is periodically inverted and a 180° radio frequency pulse is periodically applied at the same time points with the inversions of said second gradient magnetic field.

4. The high speed imaging method using three-dimensional NMR according to claim 1, wherein said second and third gradient magnetic fields are applied over a first period of dephasing nuclear spins and a second period of obtaining an echo train of spin-echoes and the application during said first period is accomplished in reverse direction to the direction provided when first spin-echoes appear in said second period.

5. A high speed imaging method using three-dimensional NMR comprising the steps of:
   (a) applying a 90° radio frequency pulse having a limited frequency band to an object while generating a first gradient magnetic field for providing a homogeneous static magnetic field with a spatial gradient along a first direction in order to selectively excite nuclear spins of a specific slice of said object placed under the homogeneous static magnetic field;
   (b) applying a 180° radio frequency pulse to said object a predetermined time after said excitation;
   (c) respectively applying second and third gradient magnetic fields for providing said static magnetic field with respective spatial gradients along a second and a third direction perpendicular to each other and within said specific slice surface during a first period of dephasing the nuclear spins and a second period for obtaining an echo train of spin-echoes so as to provide a predetermined time difference between the interval from said excitation until the application of said 180° radio frequency pulse and the interval from the application of said 180° radio frequency pulse until a peak of a first spin-echo of said echo train, wherein during said second period, one of said second and third gradient magnetic fields is constant and the other one is periodically inverted;
   (d) repeating said steps of (a)–(c) by sequentially varying said time difference, and
   Fourier-converting a measured signal obtained by each repetition using said time difference as a numerical variable so as to form a chemical shift distribution of the nuclear spins within said slice.

6. The high speed imaging method using three-dimensional NMR according to claim 5, wherein said third gradient magnetic field has a higher intensity than said second gradient magnetic field and said third gradient magnetic field is periodically inverted.

7. The high speed imaging method using three-dimensional NMR according to claim 5, wherein said third gradient magnetic field has higher intensity than said second gradient magnetic field, said third gradient magnetic field is constant and said second gradient magnetic field is periodically inverted and a 180° radio frequency pulse is periodically applied at the same time points with the inversions of said second gradient magnetic field.

8. The high speed imaging method using three-dimensional NMR according to claim 5, wherein during said first period, said second and third gradient magnetic fields are respectively applied in reverse directions to the directions of said second and third gradient magnetic fields provided when a first spin-echo appears during said second period.

9. A high speed imaging method using three-dimensional NMR comprising the steps of:
  (a) exciting nuclear spins of an object placed under a homogeneous static magnetic field;
  (b) applying a 180° radio frequency pulse to said object a predetermined time after said excitation;
  (c) applying a first gradient magnetic field with a predetermined amplitude for providing said static magnetic field with a spatial gradient along a first direction within a certain time during the period from said excitation until the generation of an echo signal by the application of said 180° radio frequency pulse;
  (d) applying second and third gradient magnetic fields for providing said static magnetic field with respective spatial gradients along a second and a third direction perpendicular to said first direction, wherein one of said second and third gradient magnetic fields is constant and the other is periodically inverted so as to form an echo train of spin-echoes;
  (e) repeating said steps (a)–(d) a plurality of times, the application of said first gradient magnetic field being sequentially varied in each repetition; and
  (f) Fourier-converting a measured signal obtained by each said repetition so as to obtain a three-dimensional distribution of nuclear spins in said object.

* * * * *